US005708577A

United States Patent [19]

Mckinley

[11] Patent Number: 5,708,577

[45] Date of Patent: Jan. 13, 1998

[54] REGULATED POWER SUPPLY

[75] Inventor: Meredith Robert Mckinley, Shoreline, Wash.

[73] Assignee: Audio Control, Mountlake Terrace, Wash.

[21] Appl. No.: 662,363

[22] Filed: Jun. 12, 1996

[51] Int. Cl.[6] ........ H03F 3/30

[52] U.S. Cl. ........ 363/89

[58] Field of Search ........ 330/297, 263, 330/267, 273, 296; 363/89, 21, 86, 87, 88; 323/282, 283

[56] References Cited

U.S. PATENT DOCUMENTS

| | | | |
|---|---|---|---|
| 4,218,660 | 8/1980 | Carver | 330/297 |
| 4,484,150 | 11/1984 | Carver | 330/297 |
| 4,586,002 | 4/1986 | Carver | 330/297 |

OTHER PUBLICATIONS

Gottlieb, Irving M., *Regulated Power Supplies*, 4th ed., TAB Books, New York, 1992.

*Primary Examiner*—Aditya Krishman

*Attorney, Agent, or Firm*—Seed and Berry LLP

[57] ABSTRACT

A regulated power supply includes a transformer having a primary winding coupled to an AC power line, and a secondary winding coupled to a rectifier. A storage capacitor is coupled through a switching transistor to the rectifier, where the storage capacitor provides a DC output power terminal. A control circuit having a comparator amplifier is coupled to the secondary winding and to the switching transistor, and compares the voltage from the secondary winding to a reference voltage value. The switching transistor is turned on from 0 to positive voltage values, as output by the rectifier, to regulate the voltage applied to the capacitor. The switching transistor switches off when the input voltage value equals or exceeds the reference value. Several passive circuit elements (e.g., diodes, resistor-capacitor networks, etc.) slow the turn on and turn off time of the switching transistor to help eliminate switching noises and other EMI.

21 Claims, 6 Drawing Sheets

REGULATED POWER SUPPLY

TECHNICAL FIELD

The present invention relates to power supply systems, particularly power supply systems that provide AC to DC regulated power conversion.

BACKGROUND OF THE INVENTION

Typical AC-DC power amplifiers employ transformers that convert an AC power line source to a "quiet" DC source for various applications such as powering an amplifier for driving one or more pairs of speakers in audio applications. However, these transformers and their related heat sinks are large, heavy and costly. Therefore, prior art methods of reducing the size, and thus the weight, of transformers have been proposed, such as in U.S. Pat. No. 4,484,150, to Carver. The Carver device is able to reduce the size of typical transformers by up to 75%. However, the Carver device tends to suffer from several limitations, such as thermal limitations when operated at full power over extended periods of time.

To further reduce the size and weight of transformers, high frequency switching power supply circuits have been employed. Such high frequency switching techniques further reduce the size of the transformers, but result in greater complexity of the power regulation circuitry. Additionally, high frequency switching circuits require high frequency transformers, which can be costly.

For example, U.S. Pat. No. 4,218,660, to Carver (the '660 patent), discloses a power transformer and amplifier where the transformer operates at a maximum power output when switched at a relatively high frequency, on the order of 20 kHz. Control circuitry produces control pulses at the 20 kHz high frequency. The voltage level at the output of the transformer is compared to the amplitude of the audio signal to be amplified so as to produce a control signal related to the difference between the two. The control signal acts through a modulator to pass portions of each control pulse, where the duration of each pulse portion is generally proportional to the magnitude of the control signal. These pulse portions in turn open and close a switch connected to the primary winding of the transformer to thereby control the current which flows through the transformer at the 20 kHz frequency.

The transformer and amplifier disclosed in the Carver '660 patent employs feedback to regulate the switching of the primary side of the transformer. The high frequency switching of the transformer can produce substantial electromagnetic interference ("EMI") which can be transmitted back down the AC power line. Many applications require that a power source for a particular application or device be electrically isolated from the application. For example, safety agencies such as Underwriter's Laboratory require that consumer electronics and other electrical devices be isolated at 60 Hz from an AC power line operating at 60 Hz. European agencies have similar isolation requirements at 50 Hz. As a result, the device shown in the '660 patent requires additional circuitry, such as a choke, to slow the switch's turn off time and thereby attenuate EMI.

Other regulated power supplies avoid some of the problems inherent in the device of the Carver '660 patent, e.g., high frequency switching. Triac systems with silicon controlled rectifier ("SCR") circuits have been used in regulated power supplies to switch the AC power line signal at a frequency lower than 20 kHz (e.g., 60 Hz). SCR circuits are typically used in inexpensive power regulation systems, such as light dimmer switches. As with the device of the Carver '660 patent, however, SCR circuits abruptly turn on and off, resulting in significant EMI problems. Again, SCR circuits cannot slow or regulate the turn off time of the circuit without the need for external components, such as a choke. Even if the SCR circuitry is moved from the primary to the secondary side of the transformer to help reduce EMI on the AC power line, nevertheless, a triggering and phase shift network or other relatively complex circuitry is still required, and the turn off time of the SCR must be controlled by external devices. Therefore, in general, SCR circuits require sophisticated, and costly, triggering and phase shift networks to reduce EMI noise.

Another drawback of prior regulated power supplies is that they can be unstable when the frequency of the AC power signal changes. For example, a given regulated power supply that operates acceptably with a 60 Hz AC power line in the United States requires significant modifications to operate equally acceptably with a 50 Hz AC power line in Europe. Such modifications can be costly. Therefore, it is difficult for a manufacturer to provide a single, readily produced power supply that is acceptable in the worldwide market.

Moreover, prior power supplies can provide sufficient power to a given load for a given size transformer. However, if the load is increased, most prior power supplies are unable to compensate for such an increased load. As a result, these power supplies, for a given size transformer, provide less power as the load significantly increases.

SUMMARY OF THE INVENTION

The present invention avoids all of the problems of the prior art, and provides additional advantages, by providing a switching regulator that operates at substantially the same frequency as the AC supply line frequency. The switching is performed at the secondary side of the transformer without the need for complex circuitry. A control circuit monitors the AC input voltage and controls the turn off of one or more switches in the switching regulator so that the switches remain on during the initial rise of the AC power line signal, but switch off, if at all, prior to the peak in the AC power signal. As described more fully below, the regulated power supply of the present invention avoids using a large transformer and heat sink, and therefore is lighter and less costly than typical high-power, large-transformer type power supplies, while still providing a high current, low voltage output.

Additionally, the present invention avoids the need for feedback circuitry, phase shift networks, and noise suppression circuits, such as chokes, while still providing accurate power regulation and EMI noise suppression. By being able to slow the on/off switching of the power supply, and by switching the power supply at the secondary side of the transformer, the regulated power supply of the present invention provides substantially less EMI noise than prior art power supplies, without the need for additional noise suppression circuitry. Any such noise generated by the present invention is inhibited from traveling back down the AC power line.

By monitoring and controlling the switching of the power supply based on the supply line voltage, the present invention can drive multiple channels and still provide the same power output. As a result, the present invention provides both line and load regulation. All of this is performed by the power supply of the present invention while still employing a single lightweight transformer. The regulated power supply of the present invention is able to provide high power output that is capable of changing its current output rapidly from several milliamps (no load) to 30 or more amps (fully loaded).

In a broad sense, the present invention embodies a regulated power supply for use with a supply of AC power which includes first and second input terminals, an input rectifier, a switch element, a power storage device and a control circuit. The first and second input terminals are coupled to the supply of AC power and provide an AC power signal having an input frequency. The AC power signal has a rising portion and a falling portion during each cycle. The input rectifier is coupled to the first and second input terminals and rectifies the AC power signal so as to provide a rectified power signal.

The switch element is coupled to an output of the rectifier to receive the rectified power signal and provide a switched power signal. The switch element is conductive during at least a portion of the rising portion of each cycle of the AC power signal. The power storage device is coupled to an output of the switch element and stores the switched powered signal to provide a stored power signal at an output terminal. The control circuit is coupled to the switch element and at least one of the first and second input terminals. The control circuit monitors the input voltage of the AC power signal. The control circuit is adapted to cause the switch element to be nonconductive prior to an end of the falling portion of each cycle of the AC power signal, and at a rate not greater than twice the input frequency.

The present invention also embodies a method of providing a regulated output power signal based on a supply of AC power. The method includes the steps of: (a) receiving an AC power signal having an input frequency, and a rising and a falling portion during each cycle; (b) rectifying the AC power signal to provide a rectified power signal; (c) intermittently passing the rectified power signal to provide a switched power signal, the switched power signal providing at least a portion of the rising portion of each cycle of the AC power signal; (d) storing the switched power signal to provide a stored power signal as a regulated output power signal; (e) monitoring the AC power signal; and (f) based on the monitored AC power signal, causing the switched power signal to be provided prior to an end of the falling portion of each cycle of the AC power signal, and at a rate not greater than twice the input frequency.

The present invention solves problems inherent in the prior art by providing a lightweight regulated power supply system that overcomes at least the problems of the prior systems described above. Various features and advantages of the present invention will become apparent from studying the following detailed description of the presently preferred embodiment, together with the following drawings.

BRIEF DESCRIPTION OF THE DRAWINGS

FIGS. 2A, 2B and 2C are exemplary voltage versus time waveforms for light, medium and heavy output loads, respectively, taken at a node A between a rectifier and a control circuit of the regulated power supply of FIG. 1.

DETAILED DESCRIPTION OF THE INVENTION

Figure 1:
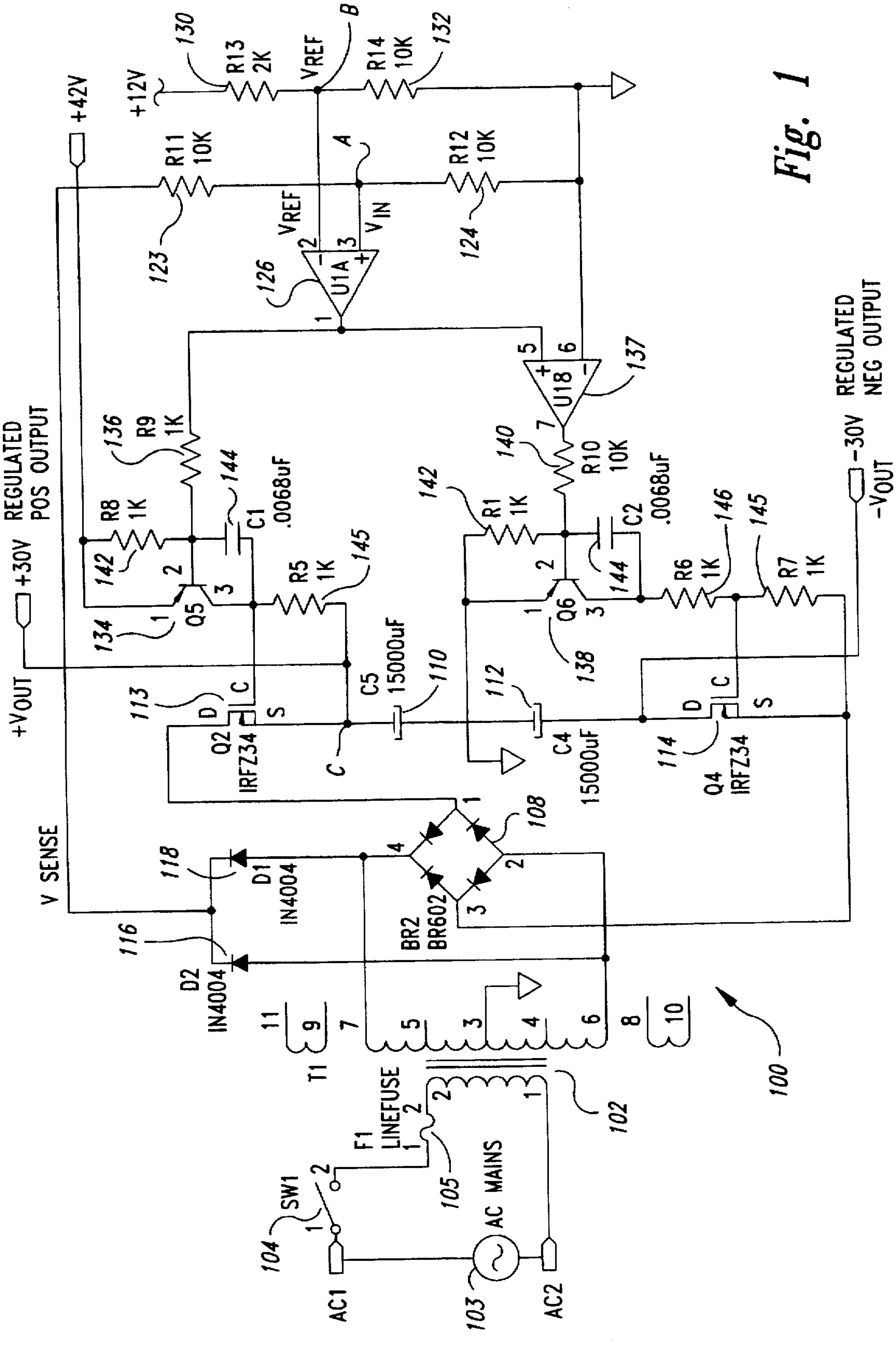
FIG. 1 is a schematic diagram showing an exemplary topology of a regulated power supply of the present invention.

Referring to FIG. 1, a regulated power supply 100 under the present invention has a transformer 102 whose primary winding is coupled to an AC power line (shown as an AC power source 103). A switch 104 and a fuse 105 can be coupled to the primary winding of the transformer 102 to switch on the regulated power supply 100 and provide over current protection, respectively. Importantly, as will become evident from the description herein, the transformer can be much smaller, lighter, and therefore less expensive than prior power supplies that rely mainly on a simple transformer and rectifier combination. As seen below, the transformer 102 includes a higher number of turns in its secondary winding than is typically employed by transformers in such prior art power supplies.

A rectifier, such as a full wave rectifier 108, is coupled to the secondary winding of the transformer 102. The full wave rectifier 108 consists of four diodes in a traditional bridge rectifier configuration. Those skilled in the art, however, will recognize that other rectifiers can be employed, including half wave rectifiers.

A pair of power storage capacitors 110 and 112 are coupled at their first terminals to the rectifier 108 through a pair of switch elements, such as n-channel MOSFET transistors 113 and 114, respectively. Of course, p-channel MOSFET transistors could be used for the transistors 113 and 114, with appropriate changes to the power supply 100. Alternatively, other types of transistors, or switching elements (e.g., relays) can be employed instead of the MOSFET transistors 113 and 114.

Plus and minus voltage output terminals $+V_{OUT}$ and $-V_{OUT}$, respectively, are also coupled to the first terminals of the capacitors 110 and 112. In operation, a steady DC voltage (e.g., + and −30V) is available at these output terminals. The second terminals of the capacitors 110 and 112 are coupled to ground.

A pair of diodes 116 and 118 are coupled to the secondary winding of the transformer 102 and provide a signal to a control circuit 120 that controls the conduction or turn off time of the gates of the MOSFET transistors 113 and 114. The control circuit 120 includes a first voltage divider circuit having serially coupled resistors 123 and 124 that are connected to the cathodes of the diodes 116 and 118. The first voltage divider circuit divides the voltage of the signal output from the diodes 116 and 118 to produce a divided input voltage $V_{IN}$ at a node A between the resistors 123 and 124. The voltage at node A has a fixed relationship and a voltage that is proportional to the voltage applied to the diodes of the rectifier 108. As a result, the voltage $V_{IN}$ at node A is substantially similar to the voltage applied to the first and second capacitors 110 and 112 when the transistors 113 and 114 are switched on.

A first comparator amplifier 126 receives the divided voltage $V_{IN}$ from node A at its non-inverting input. A second divider circuit having resistors 130 and 132 provides a reference voltage $V_{REF}$ at a node B formed therebetween. The reference voltage at node B is applied to the inverting input of the first comparator 126. As explained more fully below, when the input voltage from the transformer 102 (as measured at node A) is less than the reference voltage $V_{REF}$ at node B, then the first comparator 126 outputs a signal that switches on the MOSFET transistors 113 and 114.

A base of a first pnp bipolar transistor 134 is coupled to and receives the output signal from the first comparator 126, after first passing through a serially coupled, current limiting resistor 136. A second comparator amplifier 137 is also coupled to and receives the output of the first comparator 126 at its non-inverting input, while its inverting input is coupled to ground. A base of a second pnp bipolar transistor 138 is coupled to the output of the second comparator 137, after first passing through a serially connected, current limiting resistor 140. The emitters of the first and second bipolar transistors 134 and 138 are coupled to the gates of the first and second MOSFET transistors 113 and 114, respectively. The emitters of the first and second bipolar transistors 134 and 138 are coupled to a high positive source voltage (e.g., 42 volts) and ground to drive the gates of the first and second MOSFET transistors 113 and 114, all respectively.

A pair of resistors 145 are coupled between the source and gates of the MOSFET transistors 113 and 114. The resistors 145 help hold the MOSFET transistors 113 and 114 in their off state, and help attenuate the charge build up between the source and gates of the transistors 113 and 114 when in their off state. A resistor 146 coupled between the second bipolar transistor 138 and the gate of the second MOSFET transistor 114 forms a voltage divider with the resistor 145 so as to provide a reduced voltage to the gate of the MOSFET transistor, and thereby protect the transistor from an exceedingly high gate drive voltage (e.g., above 20 volts).

An RC network, consisting of a resistor 142 and capacitor 144, provides a time-constant delay that slows the turning off of the MOSFET transistors 113 and 114, as explained more fully below. Each resistor 142 is connected between the collector and base of the bipolar transistors 134 and 138, while each capacitor 144 is coupled between the base and emitter of the transistors 134 and 138, respectively.

In operation, the first and second bipolar transistors 134 and 138 are normally on so as to maintain the first and second MOSFET transistors 113 and 114 in their normally on condition. As a result, the rectified power signal from the rectifier 108 is allowed to charge the capacitors 110 and 112. However, when the input AC supply line voltage (as measured at node A) exceeds the reference voltage (at node B), then the comparator 126 provides a high output signal, which in turn causes the bipolar transistors 134 and 138 to switch off. As a result, the gate drive voltage previously output from the bipolar transistors 134 and 138 ceases thereby switching off the first and second MOSFET transistors 113 and 114, respectively. Consequently, the transformer 102 and rectifier 108 are then effectively disconnected from the capacitors 110 and 112, so that the additional rectified power signal is no longer applied to the capacitors.

Figure 2A:
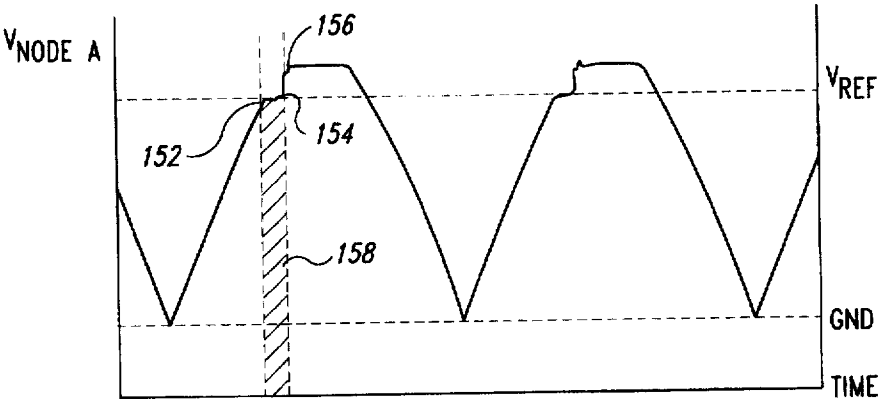
Figure 2A:
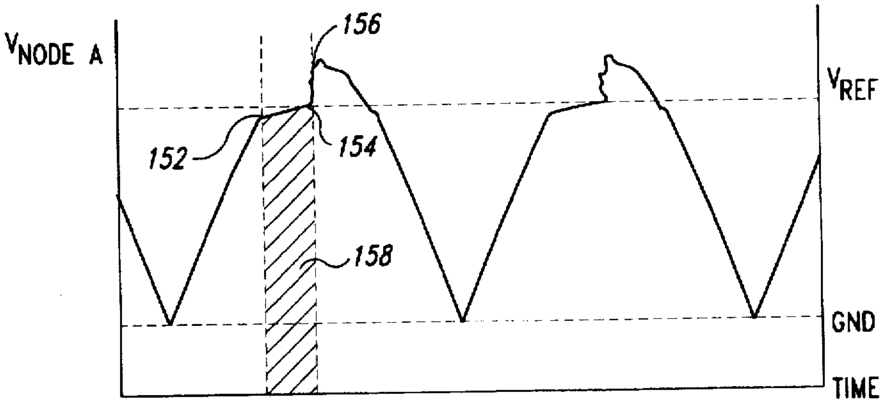
Figure 2C:
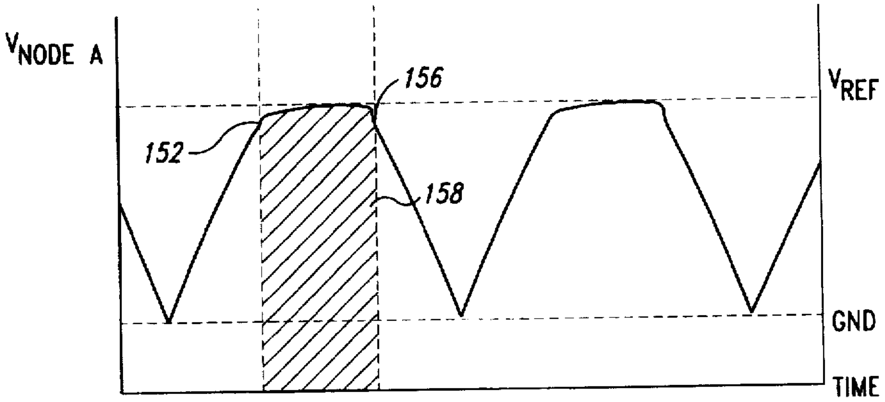

Referring to FIGS. 2A, 2B and 2C, voltage versus time waveforms taken at node A for the input voltage $V_{IN}$ are shown based on a light, medium and full load applied to the output terminals $+V_{OUT}$ and $-V_{OUT}$, respectively. Referring, for example, to a first cycle of the rectified power signal shown in FIG. 2B, the MOSFET transistors 113 and 114 are conductive since the voltage at node A (FIG. 1) is less than the reference voltage at node B. Assuming the capacitors are charged (and are not at 0 volts), then no current flows to the capacitors 110 and 112 since they are presently charged to a voltage greater than the incoming voltage from the MOSFET transistors 113 and 114, thereby reverse biasing the diodes in the rectifier 108. At a point 152 in the first cycle, the voltage applied to the rectifier 108 exceeds the voltage stored on the capacitors 110 and 112, thereby forward biasing the diodes in the bridge 108. As a result, the capacitors 110 and 112 begin charging through the rectifier 108 and transistors 113 and 114, respectively. As the voltage $V_{IN}$ continues to increase, the voltage at node A ultimately exceeds the reference voltage $V_{REF}$ at node B. As a result, at point 154, when the voltages at nodes at A and B equal, the comparator 126 outputs a high signal that in turn causes the first and second bipolar transistors 134 and 138, and ultimately the first and second MOSFET transistors 113 and 114, to switch off. Without the load of the capacitors 111 and 112 on the rectifier 108 after point 154, the voltage at node A jumps up to its peak at a point 156 before returning to 0 volts at the end of one-half of the A–C cycle. The process repeats for each cycle of the waveform as shown in FIG. 2B.

Figure 3A:
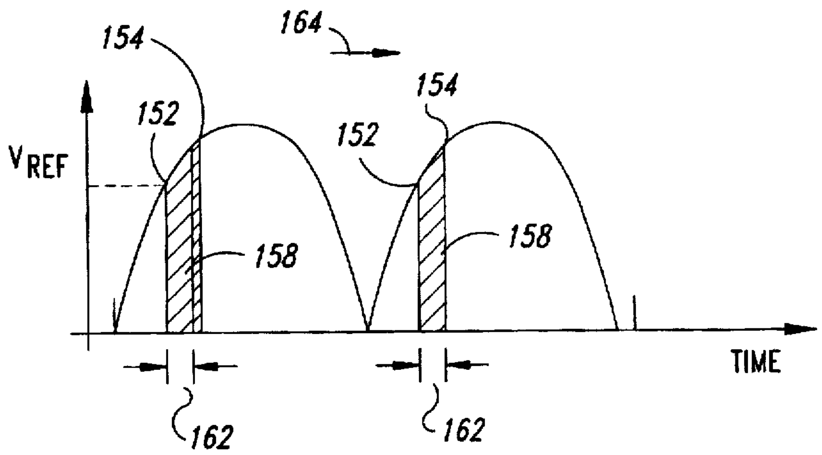
FIGS. 3A and 3B are exemplary voltage versus time and current versus time waveforms taken at the nodes A and C, of the regulated power supply of FIG. 1 under a light load, all respectively.
Figure 4A:
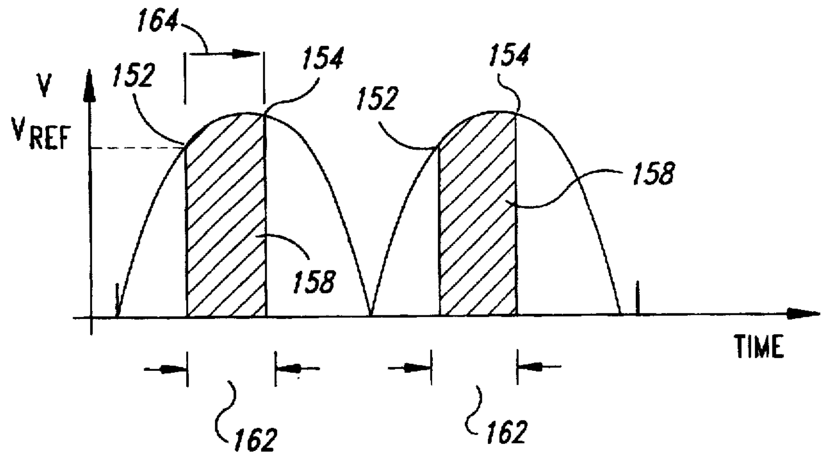
FIGS. 4A and 4B are exemplary voltage versus time and current versus time waveforms taken at the nodes A and C, of the regulated power supply of FIG. 1 under a medium load, all respectively.
Figure 5A:
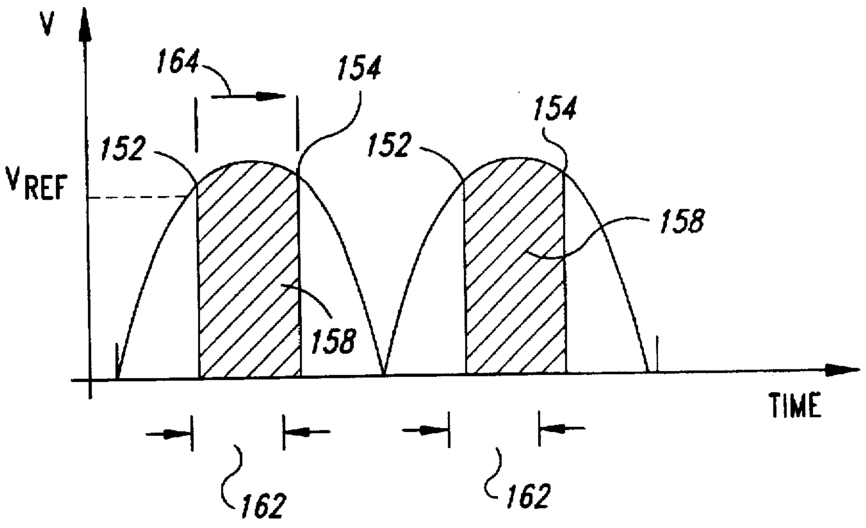
FIGS. 5A and 5B are exemplary voltage versus time and current versus time waveforms taken at the nodes A and C, of the regulated power supply of FIG. 1 under a full load, all respectively.

As shown in FIGS. 2A and 2C, the process is substantially similar regardless of the load; only the time at which $V_{IN}=V_{REF}$ differs. With the exemplary waveforms shown in FIGS. 2A, 2B and 2C, the capacitors 110 and 112 all begin storing a charge at approximately the same time (at point 152) assuming the voltages on the capacitors 110 and 112 are the same in each case. However, as seen by comparing FIGS. 2A, 2B, and 2C, when the load increases, the conduction period moves rightward in time, thereby delaying the turn off time of the first and second MOSFET transistors 113 and 114 (at point 154). Therefore, as the load increases, the time at which the voltage at node A equals the voltage at node B (i.e., $V_{IN}=V_{REF}$) is delayed. The waveforms of FIGS. 3A, 4A and 5 show the voltage at node A and the "on" period of the transistors 113 and 114 in the shaded area. As is apparent from FIGS. 3A, 4A and 5A, an interval 162 between the points 152 and 154 increases proportionally to an increase in the load from light, to medium and finally to full, respectively. The interval 162 increases as the turn off time of the MOSFET transistors 113 and 114 moves forward in time (rightward), indicated by an arrow 164.

The total amount of energy stored in the capacitors 110 and 112 is an area 156 under the curve between points 152 and 154. As can be seen by comparing the waveforms of FIGS. 2A, 2B and 2C showing the current charging the capacitors 110 and 112, the area 158 is much smaller, and thus the energy stored is less, for a light load (FIG. 2A), while it is much greater for a full load (FIG. 2C). Indeed, as shown in FIG. 2C, under a full load, the MOSFET transistors 110 and 112 do not turn off during the cycle, but instead, allow maximum power to be stored in the capacitors 110 and 112. In other words, the voltage $V_{IN}$ at node A rises enough to equal, but never exceed, the reference voltage $V_{REF}$ at node B. As a result, the present invention regulates the amount of power stored in the capacitors 111 and 112. The present invention provides such power regulation using the comparators 126 and 137, rather than employing a feedback system or other active regulation systems.

As noted above, a benefit of the regulated power supply 100 of the present invention is that the switching is performed on the secondary side of the transformer 102, rather than on the primary side. As a result, the transformer 102 and rectifier 108 attenuate or shields EMI noise caused, in part, by the switching of the MOSFET transistors 113 and 114. To further reduce EMI noise caused by abrupt state changes in the first and second MOSFET transistors 113 and 114 (i.e., rapid on and off switching), the diodes in the rectifier 108 relatively slowly conduct as a function of the slope of the incoming AC waveform. As a result, instead of abruptly switching on as in prior SCR circuits, the MOSFET transistors 113 and 114 switch on at a rate equal to a conventional diode turn on rate based on the slope of the incoming AC waveform.

Figure 3B:
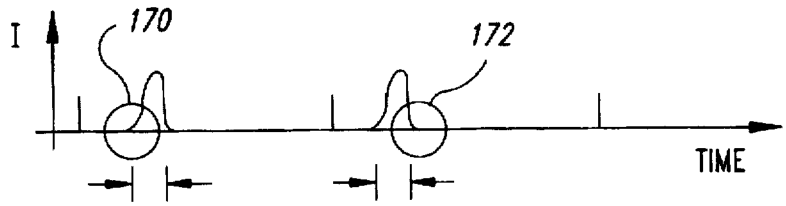

For example, as shown in FIGS. 3A and 3B, when a light load is coupled to the output terminals $+V_{OUT}$ and/or $-V_{OUT}$, the current versus time waveform (FIG. 3B) at node C changes relatively slowly during the on time of the first and second MOSFET transistors 113 and 114 (FIG. 3A). As shown by a circled portion 170 of the current versus time waveform of FIG. 3B, the change of current over time is gradual during the initial on time. Likewise, as shown in FIGS. 4A and 4B, and 5A and 5B, the change in current over time remains substantially gradual (FIGS. 4B and 5B), as the load applied to the output terminals $+V_{OUT}$ and $V_{OUT}$ increases to a medium and heavy load, respectively.

Similarly, the RC networks consisting of the resistors 142 and capacitors 144 slow the turn off time of the MOSFET transistors. Consequently, the change of current over time decreases gradually as the first and second MOSFET transistors 113 and 114 switch off. As shown by a circled portion 172 in FIGS. 3B, 4B, and 5B, the change of current over time is substantially gradual for light, medium, and heavy loads, respectively.

Of course, the turn on time of the first and second MOSFET transistors 113 and 114 can be changed, e.g., by changing the values of the diodes in the rectifier 108. Similarly, the turn off time of the MOSFET transistors 113 and 114 can be changed by changing the values of the resistors 142 and capacitors 144. Additionally, alternative known elements for slowing the turn on and turn off time of the first and second MOSFET transistors 113 and 114 can be employed instead of the diodes 116 and 118, resistors 142 and capacitors 144.

Figure 4B:
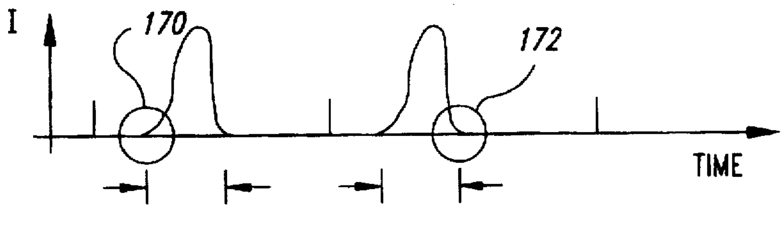
Figure 5B:
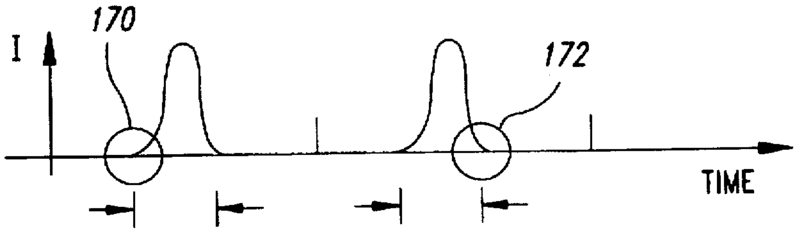

As shown in FIGS. 3B, 4B and 5B, the current changes as a function of the load. As shown by comparing FIGS. 3B, 4B, and 5B, as the load applied to the output terminals $+V_{OUT}$ and $-V_{OUT}$ increases, the current supplied to, and stored, on the capacitors 111 and 112 increases. In prior art regulated power supplies, such changes in current often produced power losses, typically in the core of the transformer of the power supply. However, the regulated power supply 100 of the present invention also produces a small conduction angle that varies proportionally to the changes in current. As a result, the regulated power supply 100 of the present invention results in less losses than prior regulated power supplies. Additionally, by being a switching power supply, the present invention produces less losses due to heat than prior, non-switching power supplies.

Possibly more importantly, the regulated power supply 100 provides a high power DC output that is capable of changing very rapidly from several milliamps (essentially no load) to over 30 amps (fully loaded). As seen by comparing FIGS. 3B, 4B and 5B, the current rises dramatically and proportionally to an increase in the load. Consequently, the regulated power supply 100 can be used to drive multiple amplifier channels (e.g., amplifiers driving eight or more pairs of audio speakers) and still provide the same power output, but with only a lightweight transformer 102.

The control circuit 120 operates passively based on the AC power signal, in other words, it operates without any active feedback. Thus, the regulated power supply 100 operates substantially in sync with the frequency of the AC power signal. The MOSFET transistors 113 and 114 are turned off at a rate equal to the twice the AC power frequency (since the power supply 100 employs a full wave rectifier 108). As a result, the regulated power supply 100 of the present invention is stable at any frequency. Importantly, it can readily provide AC to DC regulated power substantially independent of the frequency of the AC power. Therefore, the regulated power supply 100 can be employed in the U.S. with an AC power line frequency of 60 Hz, as well as in Europe with a 50 Hz AC power line frequency, without need for substantial changes to the circuitry.

Figure 6:
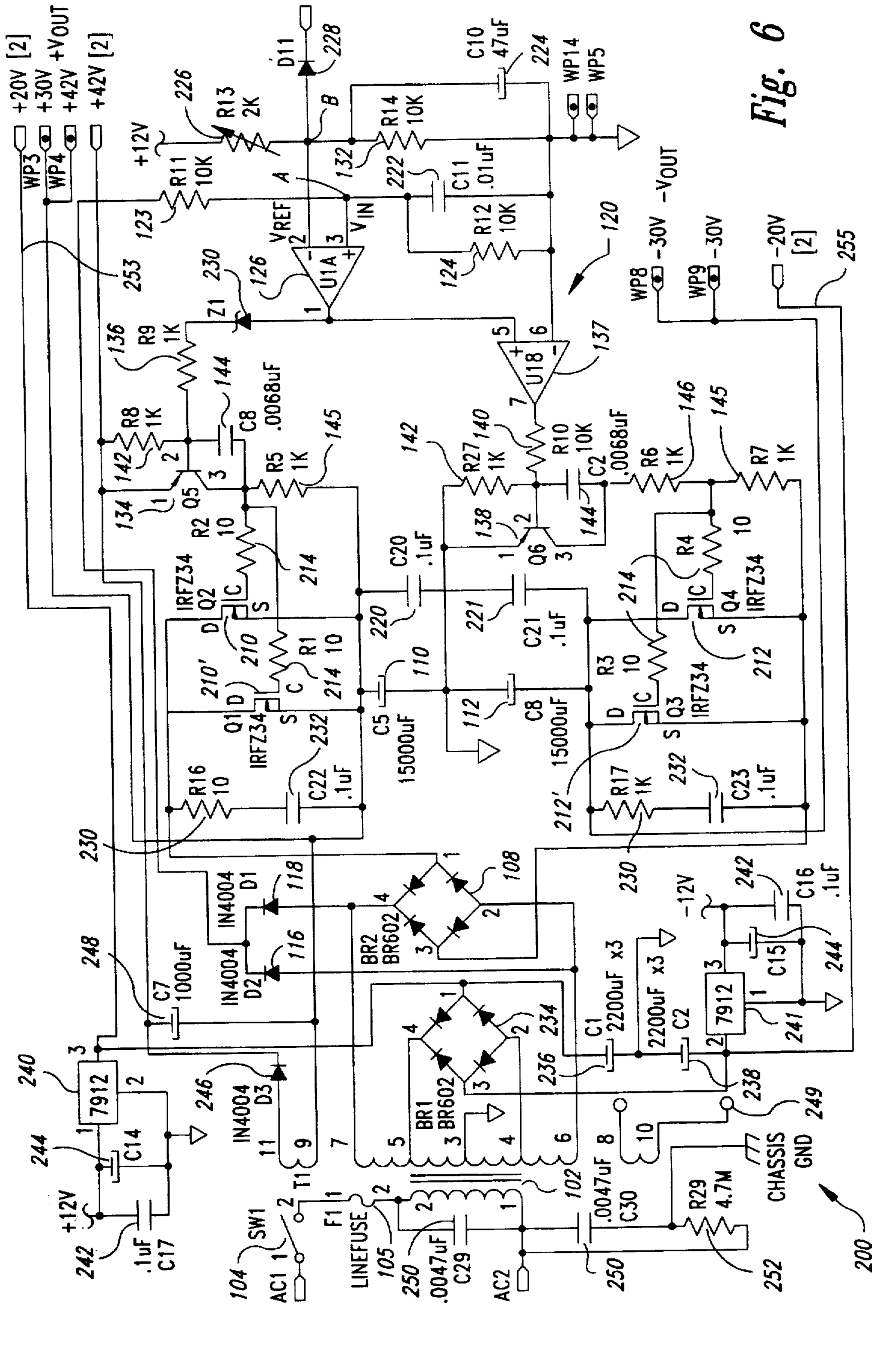
FIG. 6 is a schematic diagram of a first alternative embodiment of the regulated power supply of FIG. 1.

Referring to FIG. 6, an alternative embodiment of the present invention is shown as a regulated power supply 200 that is slightly more complex than the previous embodiment. This and other alternative embodiments described herein are substantially similar to the previously described embodiment, and common elements are identified by the same numbers. Only the significant differences in construction and operation will be described in detail.

The regulated power supply 200 replaces the first and second MOSFET transistors 113 and 114 (FIG. 1) each with a pair of MOSFET transistors 210 and 210', and 212 and 212'. By employing pairs of MOSFET transistors, the regulator power supply 200 is able to handle as high of a current as a single, larger MOSFET transistor, but two of such transistors are generally less expensive than a single transistor. Additionally, smaller MOSFET transistors typically suffer less from heat loss. Protection resistors 214 are serially coupled between the gates of each pair of MOSFET transistors 210, 210', 212, and 212' to prevent cross talk between each pair of transistors.

Capacitors 220 and 221, coupled in parallel to the first and second capacitors 110 and 112, respectively, catch and attenuate high frequency signals that can at times be applied to the capacitors. A high frequency signal could travel upstream from the load and be applied to the capacitors 111 and 112. The high frequency signals have a frequency greater than the self-resonant frequency of the capacitors 111 and 112, thus making the capacitors 111 and 112 incapable of filtering such signals.

A capacitor 222, coupled in parallel with the resistor 124, filters radio frequency interference (RFI) that can be generated between the comparators 126 and 137. In essence, the capacitor 222, together with the resistor 123, act as a low pass filter to filter RFI signals input to the non-inverting input of the second comparator 137, keeping this input essentially held to a DC voltage. A capacitor 224 coupled in parallel with the resistor 132 operates to reduce initial start up transients for the regulated power supply 200 and provides a slow (soft) start up upon power up of the power supply 200.

A potentiometer 226 in the second voltage divider circuit replaces the fixed resistor 130 (FIG. 1). As a result, the resistance of the potentiometer 226 can be adjusted so that the second voltage divider circuit provides a selectable or tuned reference voltage $V_{REF}$ at the node B. The node B is also coupled, through a diode 228, to an emergency shut down circuit or timer (not shown). The emergency shut down circuit can protect the regulated power supply 200 by immediately grounding the node B in the event of a fault. As a result, the reference voltage $V_{REF}$ at node B becomes equal to ground. Therefore, the comparator 126 will always output a high signal that turns off the first and second MOSFET transistors 113 and 114 (the input voltage $V_{IN}$ at node A becomes always equal to the reference voltage $V_{REF}$ at node B). A sleep circuit can similarly shut down the regulated power supply 200 after a selected time-out.

A Zener diode 230 coupled between the comparator 126 and the first bipolar transistor 134 acts as a level shifter to prevent currents through the base of the transistor 134 from being too large. The Zener diode 230 also allows a relatively low output voltage from the comparator 126 to be able to turn off the transistor 134, particularly as larger voltages are applied to the emitter of the transistor 134. A resistor 230 and capacitor 232 connected in series are coupled in parallel with each of the first and second MOSFET transistors 210 and 210', and 212 and 212'. The resistor 230 and capacitor 232 act as a snubber network to absorb turn-off transients produced by the MOSFET transistors 210, 210', 212, and 212', thereby further reducing EMI noise.

To provide a lower voltage (e.g., ±12 volts) supply for the power supply 200, a second full wave rectifier 234 is coupled to a low voltage tap of the secondary winding of the transformer 102. A pair of power storage capacitors 236 and 238 are coupled to the rectifier 234. The first capacitor 236 is coupled to one terminal of a three-terminal positive voltage regulator 240, where its second and third terminals are coupled to ground and to a +12 volt output terminal. Likewise, the second capacitor 238 is coupled to three-terminal negative voltage regulator 241, whose other two outputs are coupled to a −12 volt and ground terminals, respectively. The three-terminal voltage regulator regulators 240 and 241 are commonly known regulators or "7812" and "7912" regulators, respectively.

The +12V and −12V output terminals of the regulators 240 and 241 provide power to various additional systems for the power supply 200, such as an equalization board, input/output board, etc. (not shown). Similarly, to provide power to various systems for the power supply 200, plus and minus 20 volt output terminals 253 and 255 can be provided at nodes between the capacitors 236 and 238, and the voltage regulators 240 and 241, respectively.

A pair of filter capacitor 242, each coupled between the power supply and ground terminals of the voltage regulators 240 and 241, provide high frequency bypass filtering for the regulators. To store a charge for output, and to provide a load for the regulators 240 and 241, a pair of storage capacitors 244 are similarly coupled to the output and ground terminals of the regulators. Without the capacitors 244 acting as loads, the regulators could potentially enter into an unstable, oscillation mode.

The power supply 200 also provides a voltage higher than the output voltage, preferably 8–12 volts greater than the output voltage (e.g., +42 volts). Since the MOSFET transistors 210, 210', 212, and 212' have their sources coupled to the output voltage (30 volts), their gates must be biased above the source voltage in order to turn on the transistors. Therefore, a high voltage tap, taken from the secondary winding of the transformer 102, is coupled through a rectifier diode 246 and filter capacitor 248 to provide a high positive voltage rail (approximately +42 volts) for the power supply 200. The output of the diode 246, and thus the high voltage rail, are coupled to the gate of the MOSFET transistors 210, 210' through the bipolar transistor 134. Likewise, a high negative voltage rail 249, if necessary, can be provided for the power supply 200, with the addition of at least a diode and capacitor (not shown).

A pair of capacitors 250 are coupled between the primary winding of the transformer 102, and the winding and ground, respectively. The capacitors 250 provide line filtering to further reduce EMI noise from traveling back down the AC power line. A resistor 252, coupled between ground and the AC power line provides a small load to the primary winding of the transformer 102. The ground for the power supply 200 is preferably coupled to the housing or chassis enclosing the power supply. The load, provided by the resistor 252, avoids a DC offset between the primary and secondary windings of the transformer 102, and provides a path for charge build up on the chassis which could otherwise shock a user.

Figure 7:
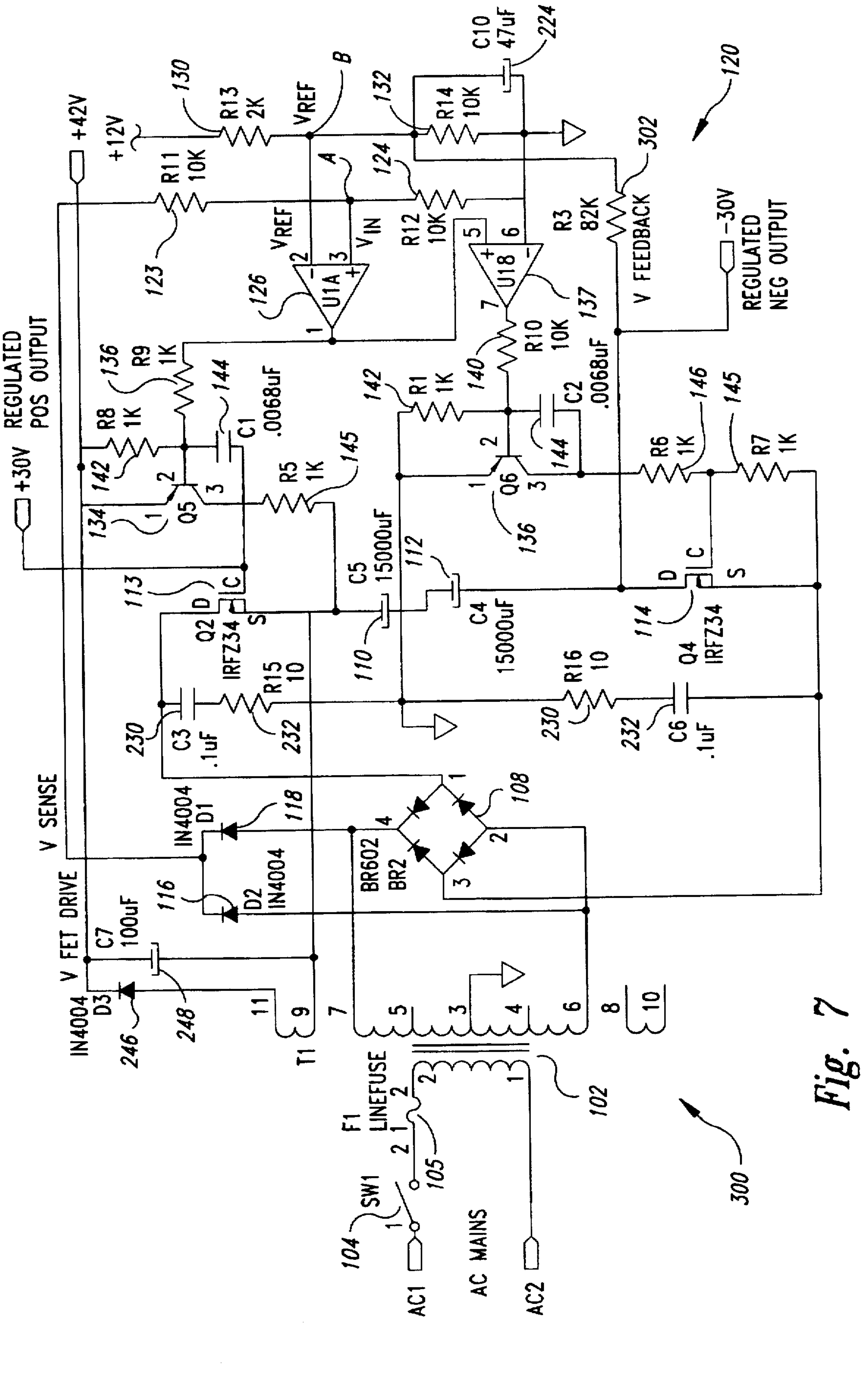
FIG. 7 is a schematic diagram of a second alternative embodiment of the regulated power supply of FIG. 1.

Referring to FIG. 7, a second alternative embodiment of the present invention is shown as a regulated power supply 300. As understood from FIG. 1, the voltage at node A of the power supply 100 is not identical to the voltage on the first and second capacitors 110 and 112, because, in part of the voltage drop across the diodes 116 and 118, etc. To compensate for this difference, the regulated power supply 300 includes an additional input signal to the control circuit 120 produced by coupling a feedback resistor 302 between the second storage capacitor 112 to the node B. The feedback resistor 302 subtracts a compensating voltage from the $V_{REF}$ reference voltage at node B. Since the voltage proportional to the output voltage is subtracted from the reference voltage $V_{REF}$, the reference voltage is inversely proportional to the output voltage. For example, as the negative voltage stored on the second storage capacitor 112 drops, the reference voltage $V_{REF}$ increases, thereby providing a greater reference voltage to the comparator 126. Consequently, the diodes 116 and 118 will conduct for a longer period of time, and the time at which $V_{IN}$ equals $V_{REF}$ occurs later during each cycle. In essence, the feedback resistor 302 provides a negative feedback to the comparator 126, thereby providing a slight trim on the reference voltage value $V_{REF}$ for the second voltage divider. As a result, the control circuit 120 monitors the voltage stored on the capacitors 110 and 112 to further control the turn off time of the MOSFET transistors 113 and 114 and thereby further regulate the amount of power stored on the capacitors. The feedback resistor 302, however, does provide a negative feedback loop for the power supply 300. Therefore, the power supply 300 of FIG. 7 can be subject to oscillation or other known problems inherent in power supplies employing negative feedback.

The U.S. patents cited above are incorporated herein by reference as if set forth in their entirety.

Although specific embodiments of, and examples for, the present invention have been described for purposes of illustration, various modifications can be made without departing from the spirit and scope of the invention, as is known by those skilled in the relevant art. For example, the regulated power supply 100 can currently be monolithically integrated, except for the transformer 102 and first and second capacitors 110 and 112. Additionally, while the regulated power supply of the present invention is generally described above as employing a full wave rectifier and providing both positive and negative DC power output signal, the present invention can be readily modified based on the detailed description provided herein to employ, for example, only a half wave rectifier and provide only a positive DC power output signal. These and other changes can be made to the invention in light of the above detailed description. Accordingly, the invention is not limited by the disclosure, but instead its scope is to be determined entirely by reference to the following claims.

In general, unless specifically set forth to the contrary herein, the terms in the claims should not be construed to limit the invention to the specific embodiments disclosed in the specification and claims, but instead should be construed to include all systems and methods for regulating an AC power source under the teachings disclosed herein. Terms such as input rectifier should generally be construed to include any device or method of rectifying a power signal, such as a switched FET transistor. Likewise, terms such as power storage device, switch element and control circuit should be construed to cover all elements that function to produce the ultimate operation of the present invention.

I claim:

1. A regulated power supply for use with a supply of AC power comprising:

first and second input terminals coupled to the supply of AC power and providing an AC power signal having an input frequency having a rising portion and a falling portion during each cycle;

a transformer having a primary winding coupled to the first and second input terminals and a secondary winding that outputs the AC power signal;

an input rectifier coupled to the secondary winding and rectifying the AC power signal output from the secondary winding so as to produce a rectified power signal;

a switch element coupled to an output of the rectifier to receive the rectified power signal and provide a switched power signal, the switch element being conductive during at least a portion of the rising portion of each cycle of the AC power signal;

a power storage device coupled to an output of the switch element to store the switched power signal and provide a stored power signal at an output terminal; and a control circuit coupled to the switch element and coupled to the secondary winding to monitor the AC power signal, the control circuit being adapted to cause the switch element to be non-conductive prior to an end of the falling portion of each cycle of the AC power signal and at a rate not greater than twice the input frequency.

2. The regulated power supply of claim 1, further comprising a voltage divider network coupled between the input rectifier and the control circuit, and wherein the control circuit compares a reference voltage value to a voltage value from the voltage divider network to cause the switch element to be non-conductive when the voltage value from the voltage divider network is equal to or greater than the reference voltage value.

3. The regulated power supply of claim 1 wherein the control circuit is coupled to the power storage device and monitors a voltage on the power storage device to cause the switch element to be non-conductive at first and second times when the voltage on the power storage device is equal to first and second voltage values, the first time being greater than the second time and the second voltage value being greater than the first voltage value.

4. The regulated power supply of claim 1 wherein the control circuit is coupled to the secondary winding of the transformer through the input rectifier.

5. The regulated power supply of claim 1, further comprising a diode coupled between the input rectifier and the control circuit, the diode slowing a time at which the switch element becomes conducting during each cycle of the AC power signal.

6. The regulated power supply of claim 1, further comprising a capacitor and a resistor coupled between the switch element and the control circuit, the capacitor and resistor slowing a time when the switch element becomes non-conducting during each cycle of the AC power signal.

7. The regulated power supply of claim 1 wherein the input frequency is approximately 60 Hz, the input rectifier is a full wave rectifier, the switch element is a transistor, the power storage device is a capacitor, and the control circuit is an operational amplifier.

8. The regulated power supply of claim 1 wherein the input rectifier, switch element and control circuit are monolithically integrated.

9. A regulated power supply for use with a supply of AC power comprising:

first and second input terminals coupled to the supply of AC power and providing an AC power signal having an input frequency, the AC power signal having a rising portion and a falling portion during each cycle;

transformer having a primary winding coupled to the first and second input terminals and a secondary winding;

an input rectifier coupled to the secondary winding and rectifying the AC power signal so as to produce a rectified power signal;

a first switch element coupled to an output of the rectifier to receive the rectified power signal and provide a switched power signal, the switch element being conductive during at least a portion of the rising portion of each cycle of the AC power signal;

a first power storage device coupled to an output of the first switch element to store the switched power signal and provide a stored DC power signal at an output terminal;

a first voltage divider network coupled between the input rectifier and the control circuit to produce a monitored voltage value; and a control circuit coupled to the voltage divider network and the first switch element, the control circuit comparing a reference voltage value to the monitored voltage value and causing the first switch element to be non-conductive when the monitored voltage value is equal to the reference voltage value, prior to an end of the falling portion of each cycle of the AC power signal, and at a rate not greater than twice the input frequency.

10. The regulated power supply of claim 9, further comprising a feedback resistor coupled between the control circuit and the first storage device, the feedback resistor modifying the reference voltage based on a voltage on the first power storage device.

11. The regulated power supply of claim 9, further comprising a diode coupled between the input rectifier and the control circuit, the diode slowing a time when the first switch element becomes conducting during each cycle of the AC power signal.

12. The regulated power supply of claim 9, further comprising a capacitor and a resistor coupled between the first switch element and the control circuit, the capacitor and resistor slowing a time when the first switch element becomes non-conducting during each cycle of the AC power signal.

13. The regulated power supply of claim 9 wherein the input frequency is approximately 60 Hz, the input rectifier is a full wave rectifier, the first switch element is a transistor, the first power storage device is a capacitor, and the control circuit includes at least one operational amplifier.

14. The regulated power supply of claim 9 wherein the input rectifier, first switch element and control circuit are monolithically integrated.

15. The regulated power supply of claim 9, further comprising a second voltage divider network having a variable resistor and coupled to the control circuit, the second voltage divider network providing a selectable reference voltage value as the reference voltage value, and wherein the control circuit compares the selectable reference voltage value to the monitored voltage value.

16. The regulated power supply of claim 9, further comprising a second switch element coupled to the output of the rectifier, a second storage device coupled to an output of the second switch element, the first and second power storage devices providing positive and negative stored DC power signals, respectively, at output terminals.

17. The regulated power supply of claim 9, further comprising a resistor and a capacitor actually a resistor a serially coupled resistor and capacitor, a resistor and capacitor being coupled as a unit in parallel with the first switch element.

18. The regulated power supply of claim 9, further comprising at least one filtered capacitor coupled in parallel to the primary winding of the transformer.

19. A method of providing a regulated output power signal based on a supply of AC power, comprising the steps of:

receiving an AC power signal having an input frequency, and a rising and a falling portion during each cycle;

transforming the AC power signal to provide a transformed AC power signal;

rectifying the transformed AC power signal to provide a rectified power signal;

intermittently passing the rectified power signal to provide a switched power signal, the switched power signal being provided during at least a portion of the rising portion of each cycle of the AC power signal;

storing the switched power signal to provide a stored power signal as a regulated output power signal;

monitoring the AC power signal; and based on the monitored AC power signal, causing the switched power signal to be provided prior to an end of the falling portion of each cycle of the AC power signal, and at a rate not greater than twice the input frequency.

20. The method of claim 19 wherein the step of providing the switched power signal includes the steps of:

providing a reference voltage value;

comparing a reference voltage value to a monitored voltage of the AC power signal; and providing the portions of the rising portion of each cycle of the AC power signal until the monitored voltage value equals the reference voltage value.

21. The method of claim 19 wherein the step of rectifying the AC power signal provides a full wave rectified power signal, and wherein the step of storing the switched power signal stores the switched power signal so as to provide a positive and a negative regulated output power signals.

* * * * *